(12) United States Patent
Koelbl (10) Patent No.: US 8,201,119 B2
(45) Date of Patent: Jun. 12, 2012

(54) FORMAL EQUIVALENCE CHECKING BETWEEN TWO MODELS OF A CIRCUIT DESIGN USING CHECKPOINTS

(75) Inventor: Alfred Koelbl, Dachau (DE)

(73) Assignee: Synopsys, Inc., Mountain View, CA (US)

( * ) Notice: Subject to any disclaimer, the term of this patent is extended or adjusted under 35 U.S.C. 154(b) by 125 days.

(21) Appl. No.: 12/775,063

(22) Filed: May 6, 2010

(65) Prior Publication Data

US 2011/0276934 A1 Nov. 10, 2011

(51) Int. Cl.
*G06F 17/50* (2006.01)

(52) U.S. Cl. ........ 716/107; 716/103; 716/104; 716/111; 716/136; 703/16

(58) Field of Classification Search .................. 716/107, 716/103, 104, 111, 136; 703/16
See application file for complete search history.

(56) References Cited

U.S. PATENT DOCUMENTS

| | | | | |
|---|---|---|---|---|
| 5,841,663 A * | 11/1998 | Sharma et al. | ................ | 716/104 |
| 6,421,818 B1 * | 7/2002 | Dupenloup et al. | ........ | 716/105 |
| 6,651,225 B1 * | 11/2003 | Lin et al. | ....................... | 716/113 |
| 2002/0162086 A1 * | 10/2002 | Morgan | ......................... | 716/18 |
| 2002/0194572 A1 * | 12/2002 | McElvain et al. | ................ | 716/1 |
| 2005/0091025 A1 * | 4/2005 | Wilson et al. | .................... | 703/16 |
| 2006/0117274 A1 * | 6/2006 | Tseng et al. | ...................... | 716/1 |
| 2011/0197171 A1 * | 8/2011 | Wang et al. | .................... | 716/107 |
| 2011/0307233 A1 * | 12/2011 | Tseng et al. | .................... | 703/14 |

* cited by examiner

*Primary Examiner* — Phallaka Kik
(74) *Attorney, Agent, or Firm* — Park, Vaughn, Fleming & Dowler LLP; Laxman Sahasrabuddhe (57) ABSTRACT

Some embodiments of the present invention provide techniques and systems for determining whether a high-level model (HLM) for a circuit design is equivalent to a register-transfer-level (RTL) model for the circuit design. During operation, a system can identify a set of checkpoints. Each checkpoint can be associated with a characteristic function defined over the states of a finite-state-machine (FSM) representation of the HLM, a characteristic function defined over the states of an FSM representation of the RTL model, and an invariant defined over a set of variables in the HLM and a set of registers in the RTL model. Next, the system can generate a set of invariant proof problems, wherein each invariant proof problem corresponds to a transition between two checkpoints in the set of checkpoints. The system can then determine whether the HLM is equivalent to the RTL model by solving the set of invariant proof problems.

21 Claims, 9 Drawing Sheets

FORMAL EQUIVALENCE CHECKING BETWEEN TWO MODELS OF A CIRCUIT DESIGN USING CHECKPOINTS

BACKGROUND

1. Technical Field

This disclosure relates to electronic design automation (EDA). Specifically, this disclosure relates to methods and systems for performing formal equivalence checking between two models of a circuit design using checkpoints.

2. Related Art

Rapid advances in technology have made it possible to integrate complex large-scale systems onto a single semiconductor chip. In order to keep up with this rapid increase in size and complexity, circuit designers are designing hardware at increasingly higher levels of abstraction. Note that higher levels of abstraction are inherently faster to simulate. Hence, representing an IC (integrated circuit) design at a high level of abstraction facilitates performing more complex design exploration and more thorough validation. For example, some circuit design flows begin by writing an IC design specification in a high-level programming language, such as C, C++, SystemC, SystemVerilog, etc. Such high-level descriptions of the circuit design are often referred to as a high-level model (HLM) for the IC design.

In a typical design flow, the level of abstraction decreases as the circuit design progresses through the design flow. For example, a circuit design which is represented using an HLM at the beginning of the design flow may be represented using a register-transfer-level (RTL) model at a later stage in the design flow. The question of functional equivalency arises whenever the same circuit design is described at different levels of abstraction. For example, when an HLM for a circuit design is converted into an RTL model, it is important to ensure that the two models are functionally equivalent.

There are generally two approaches for checking functional equivalency between two models. The first approach is to exhaustively simulate the two models to ensure that the inputs and outputs for the two models are exactly the same under all conditions. Unfortunately, this approach is usually impractical because of the immense computational resources required to exhaustively simulate the two models. Note that, if we do not perform exhaustive simulation, we cannot guarantee functional equivalency between the two models.

The other approach uses formal verification techniques to prove that the two models are functionally equivalent. Unfortunately, this approach often runs into serious runtime and memory issues because the computational resources required to formally verify a circuit design can grow exponentially with the circuit design size.

Hence, what is needed are techniques and systems for checking equivalency between two models of a circuit design without the above-described problems.

SUMMARY

Some embodiments of the present invention provide systems and techniques for determining whether an HLM is equivalent to an RTL model.

When the system creates an RTL model from an HLM, the system can determine a mapping between variables in the HLM and registers in the RTL model. Next, the system can identify a set of checkpoints. Each checkpoint can be associated with a characteristic function which uses one or more states of a finite-state-machine (FSM) representation of the HLM, wherein the characteristic function specifies when the HLM is at the checkpoint. The characteristic function can be associated with a location in the HLM, wherein the location is either before or after a program statement in the HLM. For example, the characteristic function can evaluate to a TRUE value only at a particular location in the HLM. The checkpoint can also be associated with a characteristic function which uses one or more states of an FSM representation of the RTL model, wherein the characteristic function specifies when the RTL model is at the checkpoint. Further, the checkpoint can be associated with an invariant which is defined over a set of variables in the HLM and a corresponding set of registers in the RTL model, wherein the invariant specifies a relationship (e.g., an equivalence relationship) between a variable in the set of variables and a register in the set of registers at a given time-point.

The system can then generate a set of invariant proof problems, wherein each invariant proof problem corresponds to a transition between two checkpoints in the set of checkpoints. Next, the system can determine whether the HLM is equivalent to the RTL model by solving the set of invariant proof problems. The invariant proof problems can be solved by using any of the standard proof techniques and solvers that operate on Boolean formulas. For example, the invariant proof problems can be solved by using Satisfiability (SAT) solvers or Satisfiability Modulo Theories (SMT) solvers.

An abstract state transition graph (ASTG) for the HLM can be used to generate the set of invariant proof problems. In some embodiments, before generating the set of invariant proof problems, the system can determine whether the ASTG for the HLM is equivalent to an ASTG for the RTL model. Specifically, the system can determine an ASTG for the HLM. Next, for each transition in the ASTG for the HLM, the system can determine whether the ASTG for the RTL has an equivalent transition. If the system determines that the ASTG for the HLM is not equivalent to the ASTG for the RTL, the system can report that the HLM is not equivalent to the RTL model. On the other hand, if the system determines that the ASTG for the HLM is equivalent to the ASTG for the RTL model, the system can then generate the set of invariant proof problems. Specifically, the system can generate an invariant proof problem for each edge in the ASTG for the HLM (which is equivalent to generating an invariant proof problem for each edge in the ASTG for the RTL model).

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Figure 1:
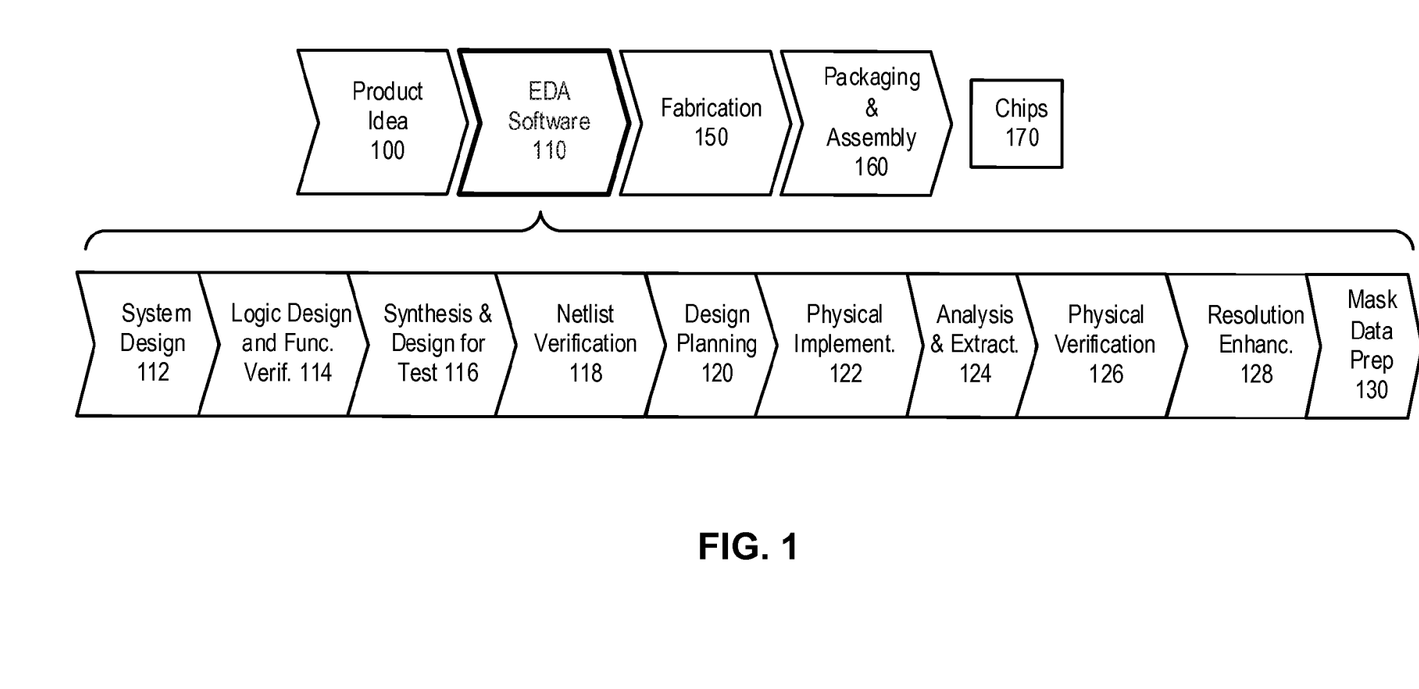
FIG. 1 illustrates various steps in the design and fabrication of an integrated circuit.

FIG. 1 illustrates various steps in the design and fabrication of an integrated circuit. The process typically starts with a product idea 100, which is realized using Electronic Design Automation (EDA) software 110. Chips 170 can then be produced from the finalized design by performing fabrication 150 and packaging and assembly 160.

A design flow that uses EDA software 110 is described below. Note that the design flow description is for illustration purposes only, and is not intended to limit the present invention. For example, an actual integrated circuit design may require a designer to perform the design flow steps in a different sequence than the sequence described below.

In the system design step 112, the designers can describe the functionality to implement. They can also perform what-if planning to refine the functionality and to check costs. Further, hardware-software architecture partitioning can occur at this step. In the logic design and functional verification step 114, a Hardware Description Language (HDL) design can be created and checked for functional accuracy.

In the synthesis and design step 116, the HDL code can be translated to a netlist, which can be optimized for the target technology. Further, tests can be designed and implemented to check the finished chips. In the netlist verification step 118, the netlist can be checked for compliance with timing constraints and for correspondence with the HDL code.

In the design planning step 120, an overall floor plan for the chip can be constructed and analyzed for timing and top-level routing. Next, placement and routing can be performed in the physical implementation step 122.

In the analysis and extraction step 124, the circuit functionality can be verified at a transistor level. In the physical verification step 126, the design can be checked to correct any functional, manufacturing, electrical, or lithographic issues.

In the resolution enhancement step 128, geometric manipulations can be performed on the layout to improve manufacturability of the design. Finally, in the mask data preparation step 130, the design can be taped-out for production of masks to produce finished chips.

Checkpoint

Some embodiments of the present invention provide a technique for checking formal equivalence between an HLM and a corresponding RTL model. This technique employs the fact that there are certain locations in the execution flow of an HLM where a mapping between variables in the HLM and registers in the RTL model is known. A checkpoint can be introduced at such locations. A high-level synthesis (HLS) tool can automatically identify checkpoint locations and determine the mapping between variables and registers. The HLS can also automatically insert checkpoints at certain locations. For example, the HLS can insert a checkpoint at the beginning of the HLM, at the end of the HLM, and at the beginning of each loop in the HLM. The user can also manually perform these tasks, i.e., insert and/or change checkpoints and provide the mapping between variables and registers. In some embodiments, the HLS can automatically insert checkpoints and provide the mapping between variables and registers, and then the user can add, delete, or modify the set of checkpoints and/or the mapping between variables and registers.

Once the checkpoints have been identified, they can be used to decompose a complex formal equivalence checking problem into a number of smaller invariant proof problems. Specifically each transition or edge in an abstract state transition graph (ASTG) from one checkpoint to another checkpoint can be used to generate an invariant proof problem. If a formal verification tool is able to generate proofs for all of the invariant proof problems, the HLM and the RTL model can be declared to be functionally equivalent.

In some embodiments, a checkpoint can have three components. The first component can be a characteristic function (e.g., a Boolean function over the states of an FSM representation of the HLM) or describe a location in the program code of the HLM where the checkpoint is inserted. A checkpoint can be inserted either before or after a program statement in the HLM.

The second component of the checkpoint can specify a state or a set of states in a finite-state-machine (FSM) based representation of the RTL model. Specifically, a checkpoint in the RTL model can be represented by a Boolean function defined over one or more registers in the RTL model. This Boolean function, called the characteristic function, returns TRUE whenever the FSM is in the state or set of states that corresponds to the checkpoint.

For example, if the RTL model has two single-bit FSM state registers reg_a, reg_b and a checkpoint is associated with the set of states (reg_a, reg_b)=(1, 0) and (reg_a, reg_b)=(0, 1), the characteristic function of the set of states which represents the checkpoint can be written as (reg_a & ~reg_b)|(~reg_a & reg_b). Note that the capability to specify a checkpoint in the corresponding RTL model in terms of one or more FSM states through a characteristic function does not require exact knowledge of the entire FSM, i.e., the system does not need an explicit representation of all the states of the FSM. The system only needs to know the FSM states that are required in the characteristic function.

While the first and the second components describe how a given checkpoint is defined within the HLM and the corresponding RTL model, the third component describes the relationship between variables in the HLM and registers in the corresponding RTL model. This relationship can be described in the form of invariants, which are essentially characteristic functions that hold TRUE if the invariant relationship holds. The invariants can refer to variables in the HLM and registers in the corresponding RTL model at time-points that can be specified relative to the checkpoint.

For example, an "(s)" or "(i)" can be appended to the variable or register name, wherein "(s)" refers to the checkpoint in the HLM, while "(i)" refers to the checkpoint in the corresponding RTL model. An invariant that specifies that HLM variable var_x is equivalent to RTL register reg_x in the checkpoint can be written as (var_x(s)==reg_x(i)). If we need to specify that variable var_x in the HLM in the checkpoint is equivalent to the RTL register reg_x one cycle after the checkpoint in the corresponding RTL model, the invariant can be written as (var_x(s)==reg_x(i+1 cycle)). Note that the capability to specify invariants at time-points relative to a checkpoint is important for writing invariants for a pipelined circuit design. All outputs of an IC design that need to be checked for equivalence may need to be included in the invariants.

Figure 2A:
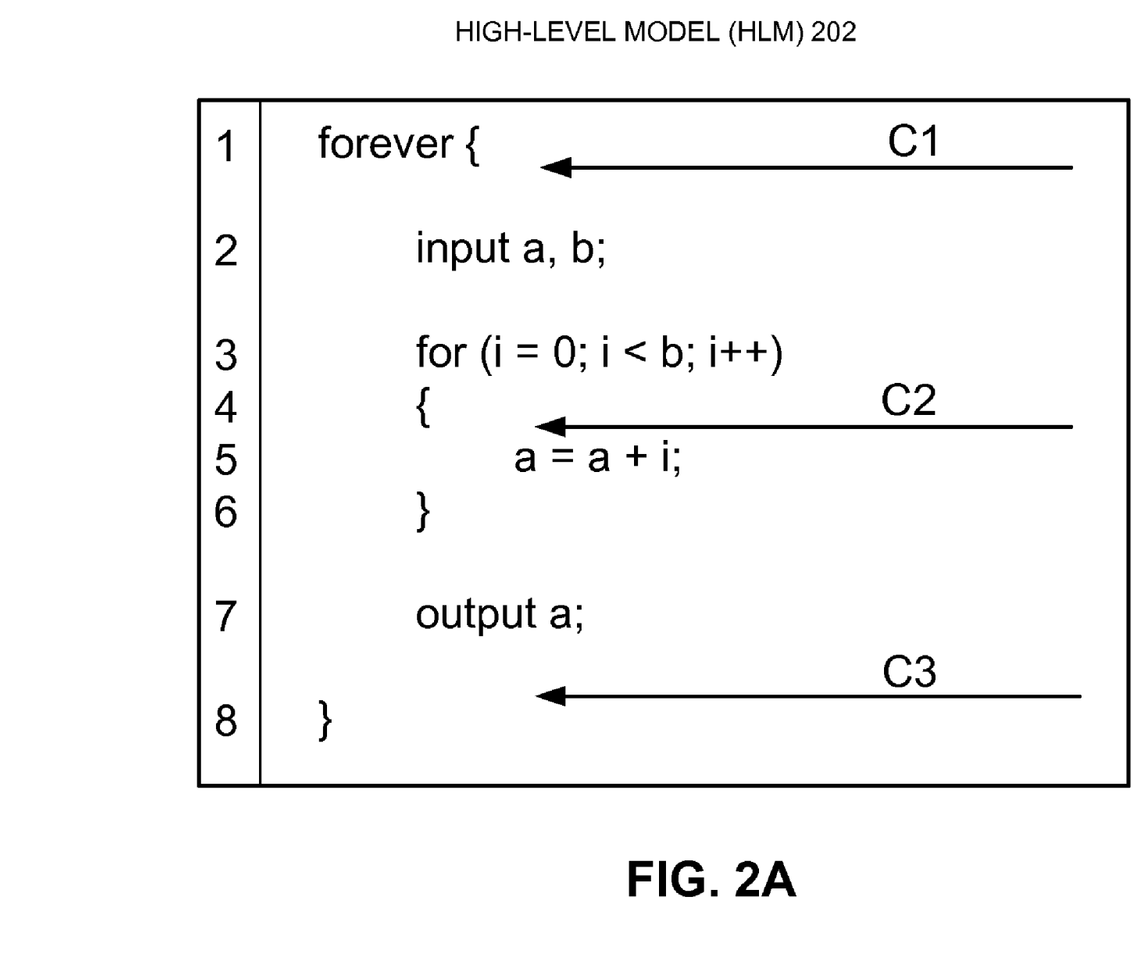
FIG. 2A illustrates checkpoints in an HLM in accordance with some embodiments of the present invention.

FIG. 2A illustrates checkpoints in an HLM in accordance with some embodiments of the present invention. HLM 202 includes three variables: a, b, and i. Checkpoint C1 is inserted before line 2, checkpoint C3 is inserted after line 7, and checkpoint C2 is inserted before the add statement "a=a+i" on line 5. In general, a checkpoint in the HLM can be represented using a characteristic function. However, in the example shown in FIG. 2A, the checkpoints are represented using locations in an HLM.

Figure 2B:
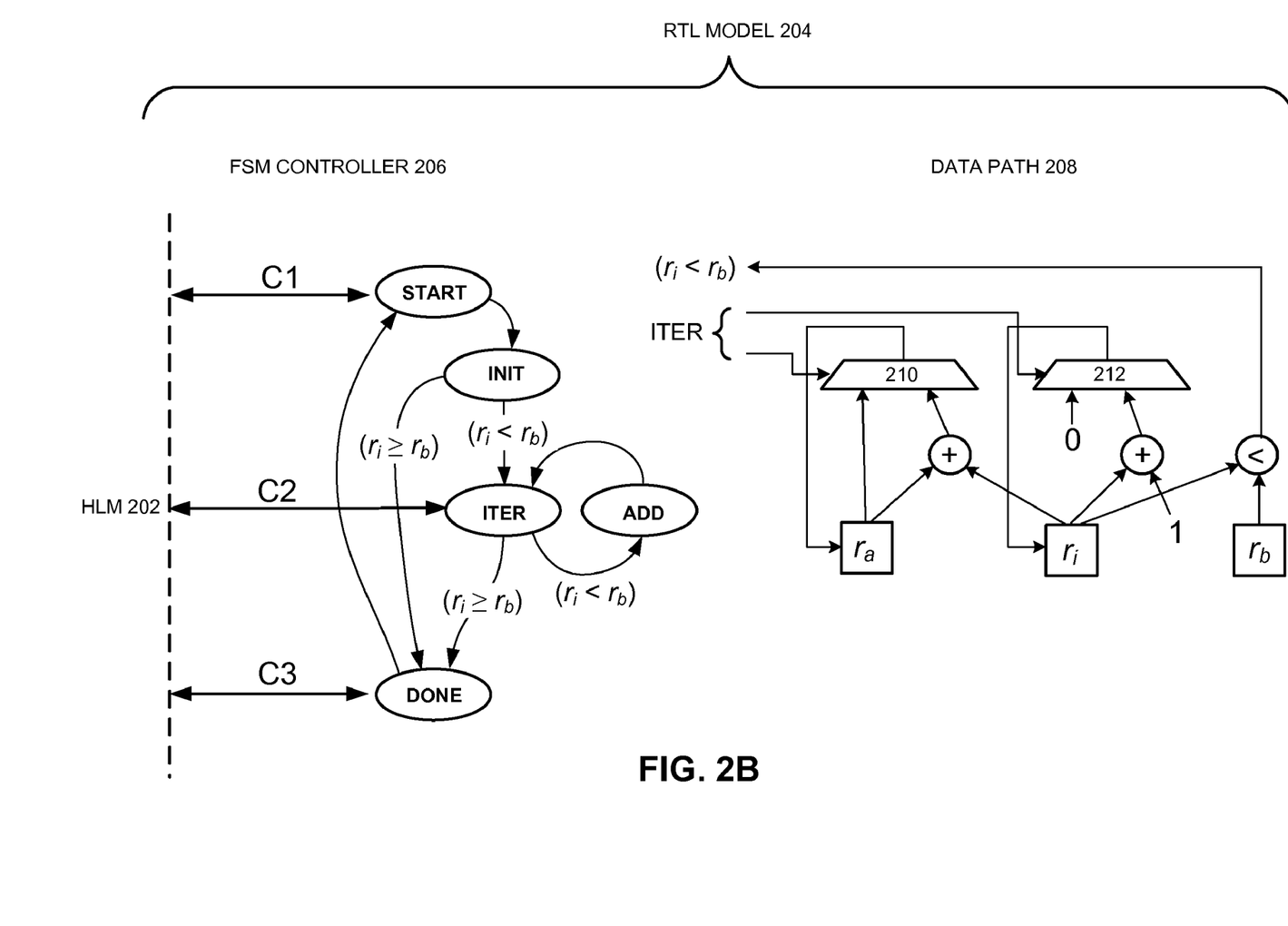
FIG. 2B illustrates an RTL model which corresponds to an HLM in accordance with some embodiments of the present invention.

FIG. 2B illustrates an RTL model which corresponds to an HLM in accordance with some embodiments of the present invention.

RTL model 204 corresponds to HLM 202, and includes FSM controller 206 and data path 208. FSM controller 206 includes FSM states "START," "INIT," "ITER," "ADD," and "DONE." Data path 208 includes registers $r_a$, $r_b$, and $r_i$ which correspond to HLM variables a, b, and i, respectively.

The arrows in FSM controller 206 denote transitions between the states. Checkpoints C1, C2, and C3 correspond to states "START," "ITER," and "DONE," respectively. The transition from "START" to "INIT" is always taken. The transition from "INIT" to "DONE" is taken if $(r_i<r_b)$ is false. Note that the output of the comparator in data path 208 is equal to the expression $(r_i<r_b)$. The transition from "INIT" to "ITER" is taken if $(r_i<r_b)$ is true. The transition from "ITER" to "DONE" is taken if $(r_i<r_b)$ is false, and the transition from "ITER" to "ADD" is taken if $(r_i<r_b)$ is true. The transition from "ADD" to "ITER" is always taken. Finally, the transition from "DONE" to "START" is also always taken. The value of the control input for multiplexers 210 and 212 can be determined based on whether FSM controller 206 is in state "ITER" or not. Specifically, if FSM controller 206 is not in state "ITER," the control inputs of multiplexers 210 and 212 select the left input. This causes the value of register $r_a$ to be circulated, and the value of register $r_i$ to be initialized to zero. On the other hand, if FSM controller 206 is in state "ITER," the control inputs of multiplexers 210 and 212 select the right input. This causes the value $(r_a+r_i)$ to be stored in register $r_a$, and the value in register $r_i$ to be incremented by one.

Since variables a, b, and i correspond to registers $r_a$, $r_b$, and $r_i$, the following three invariants must hold at each of the three checkpoints: $(a(s)==r_a(i))$, $(b(s)==r_b(i))$, and $(i(s) r_i(i))$. (Note that the "i" in the subscript refers to the variable i, whereas the "i" within the brackets refers to the checkpoint i.) The invariants in this example were relatively simple. However, in general, an invariant can be an arbitrarily complex Boolean expression.

Abstract State Transition Graph (ASTG)

Once the checkpoints are known, an abstract state transition graph (ASTG) can be determined. An ASTG comprises a set of nodes (or vertices) that are connected via a set of directed edges. Each node represents a checkpoint. Each directed edge in the graph originates at a start-node (which corresponds to a start-checkpoint) and terminates at an end-node (which corresponds to an end-checkpoint), and is associated with a condition under which the end-node is reached from the start-node. Each edge in the ASTG corresponds to a transition from the start-checkpoint to the end-checkpoint.

Various techniques can be used to build an ASTG for an HLM. One technique uses symbolic simulation to build the ASTG. Specifically, for each start-checkpoint (which corresponds to a start-node in the ASTG), the system performs symbolic simulation to determine the end-checkpoints that are reached from the start-checkpoint, and for each pair of such checkpoints, the system creates an edge in the ASTG.

Figure 3:
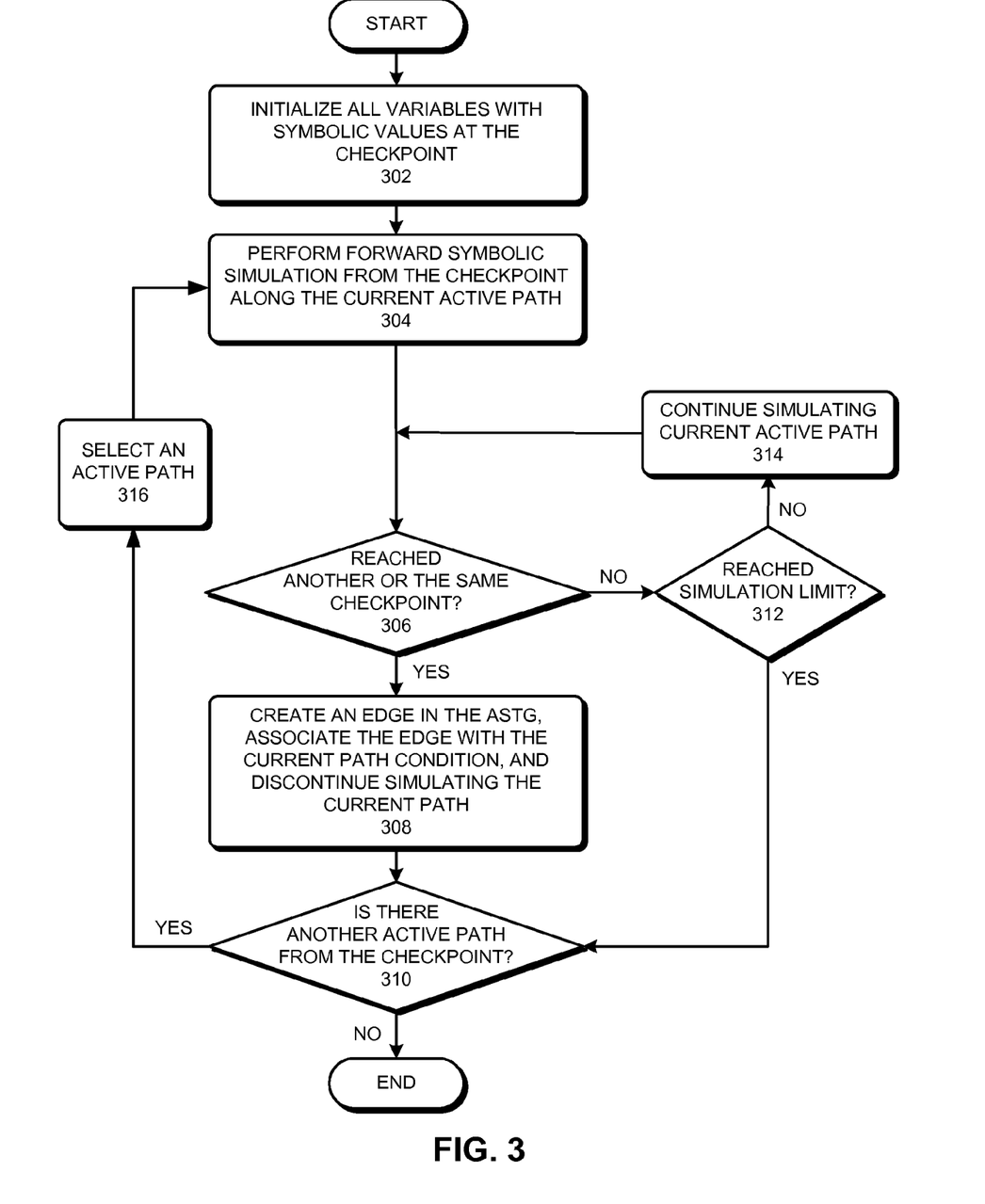
FIG. 3 presents a flowchart illustrating a process for building an abstract state transition graph (ASTG) in accordance with some embodiments of the present invention.

FIG. 3 presents a flowchart illustrating a process for building an ASTG in accordance with some embodiments of the present invention. Specifically, an ASTG can be built by performing the process illustrated in FIG. 3 for each checkpoint.

The process begins by initializing all variables with symbolic values at a checkpoint (step 302). For example, if the HLM has two variables, var_a and var_b, then the variables can be initialized at the checkpoint using symbolic values s_a and s_b, respectively. In other words, the system can symbolically simulate the following assignments at the checkpoint: var_a=s_a; var_b=s_b.

The system can then select an active path for simulation, and perform forward symbolic simulation from the checkpoint along the current active path (step 304) by symbolically executing each statement in the HLM in the current active path. Symbolic simulation determines expressions in terms of the symbolic values instead of determining concrete values for variables. For example, if the variables var_a and var_b are initialized as shown above, symbolic simulation of the statements:

var_a=var_a+var_b;

var_b=var_a*2;

would result in the following symbolic expressions (the asterisk symbol denotes multiplication):

"var_a=s_a+s_b"; and

"var_b=(s_a+s_b)*2".

In addition to computing symbolic expressions, symbolic simulation implicitly simulates all paths through the HLM code. For each path in the HLM code, a path condition can be computed which describes the conditions under which the path is executed. For example, suppose the following "if" statement is present after the code shown above:

```
if (var_a == 3) {
    [THEN BRANCH CODE];
}
else {
    [ELSE BRANCH CODE];
}.
```

Then, the path condition for the "THEN BRANCH CODE" would be ((s_a+s_b)==3), and the path condition for the "ELSE BRANCH CODE" would be ((s_a+s_b)!=3).

After each symbolic simulation step, the system can check if another or the same checkpoint has been reached (step 306). If so, the system can create an edge in the ASTG, associate the edge with the current path condition, and discontinue simulating the current path (step 308). The system then determines if there are still other active symbolic paths from the checkpoint (step 310). If so, the system selects an active path (step 316), and returns to step 304 to perform forward symbolic simulation from the selected active path (which is now the current active path).

The process stops if either all symbolic paths have reached another checkpoint or a simulation limit is reached. This latter case indicates that there may be paths in the HLM which do not reach any checkpoints. Specifically, if at step 306, the system determines that a checkpoint has not been reached, the system can check if a simulation limit has been reached (step 312). The simulation limit can be specified in terms of a number of symbolic simulation steps or statements, a runtime limit, or a combination thereof. If the simulation limit is reached, the system can discontinue simulating the current active path and go to step 310 to check if there are other active paths from the checkpoint. On the other hand, if the simulation limit has not been reached, the system can continue simulating the current active path (step 314), and return to step 306 to check if another or the same checkpoint has been reached.

Note that the process shown in FIG. 3 is for illustration purposes only and is not intended to limit the present invention. Specifically, in some embodiments, the system can perform symbolic simulation on multiple paths in parallel instead of performing symbolic simulation on one path at a time.

Figure 4A:
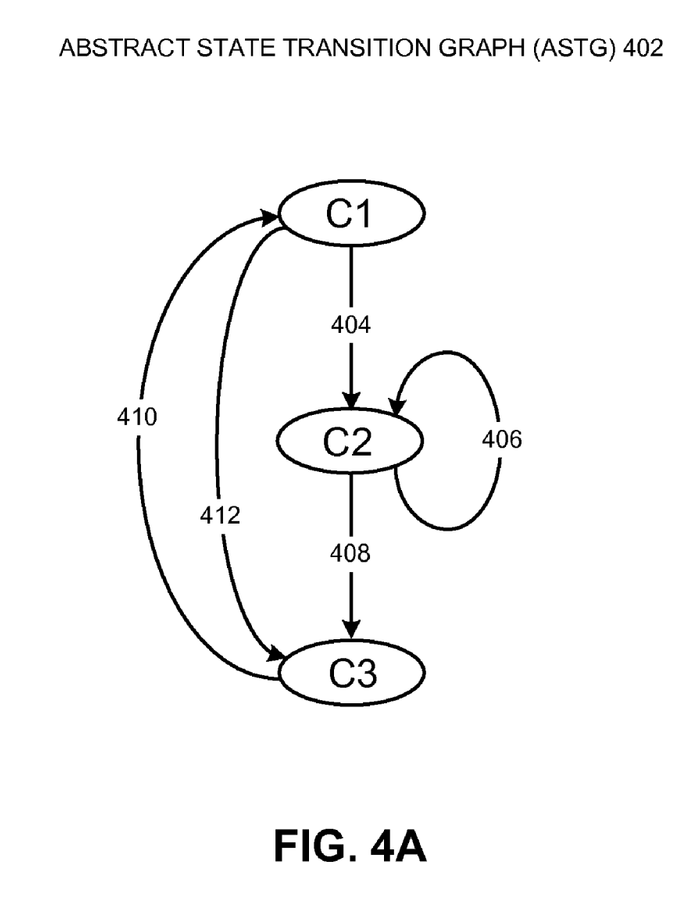
FIG. 4A illustrates an ASTG for an HLM in accordance with some embodiments of the present invention.

FIG. 4A illustrates an ASTG for an HLM in accordance with some embodiments of the present invention.

ASTG 402 includes a set of transition edges between checkpoints C1, C2, and C3 in HLM 202 shown in FIG. 2A. To build ASTG 402, the system can start by creating nodes for the three checkpoints.

The system can perform symbolic simulation from checkpoint C1 and determine that there are two simulation paths: one path that reaches checkpoint C2 when the "for" loop is entered, and another that reaches checkpoint C3 when the "for" loop is not entered. The system can create edges 404 and 412 that correspond to these two simulation paths. Further, the system can associate path conditions with these two edges based on when the paths are taken. Based on HLM 202, the path conditions for edges 404 and 412 are "$i<b$" and "$i \geq b$," respectively.

Next, the system can perform symbolic simulation from checkpoint C2 and determine that there are two simulation paths: one path that loops back to itself when the "for" loop iterates, and another that reaches checkpoint C3 when the "for" loop terminates. Accordingly, the system can create edges 406 and 408 that correspond to these two simulation paths. Further, the system can associate path conditions "$i<b$" and "$i \geq b$" with edges 406 and 408, respectively.

Finally, the system can perform symbolic simulation from checkpoint C3 and determine that there is a single simulation path that reaches checkpoint C1 under all conditions (this path corresponds to the "forever" loop).

Accordingly, the system can create edge 410 from checkpoint C3 to checkpoint C1 and associate a path condition that is always true with the edge. For example, the system can associate the path condition "1" or "true" with the edge.

In some embodiments, the system creates an ASTG for the RTL model in a similar fashion. Specifically, the system can start at a checkpoint in the RTL model and symbolically simulate the RTL model until the characteristic function of another checkpoint or the same checkpoint becomes true. The system can then create an edge between the two checkpoints in the ASTG. Once the system has created the two ASTGs, the system can check whether the two ASTGs are isomorphic, and whether the corresponding transitions in the two ASTGs are triggered by the same conditions. If so, then the system can declare that the HLM and the RTL model are functionally equivalent.

Figure 4B:
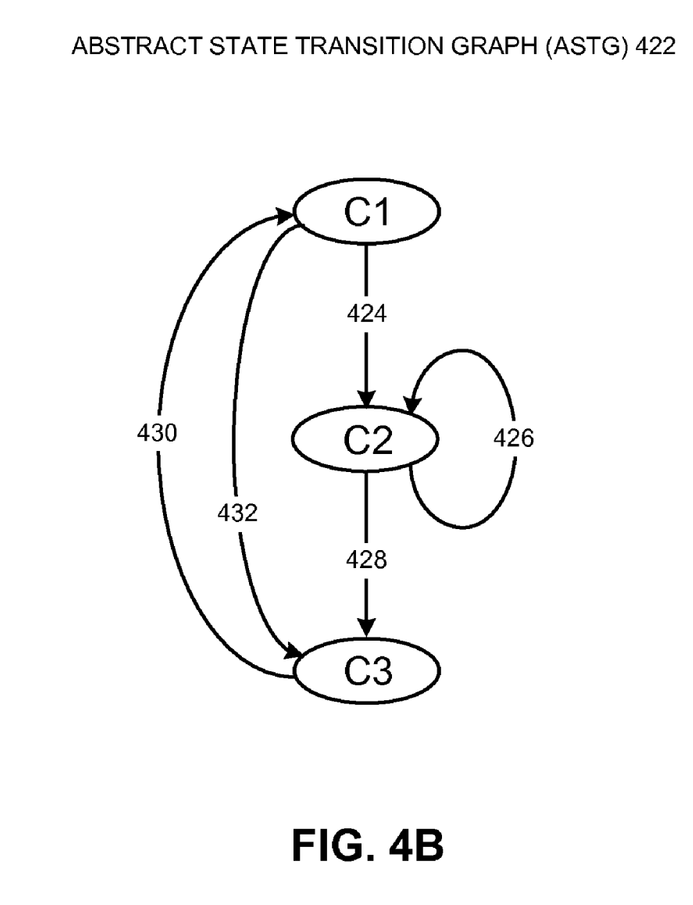
FIG. 4B illustrates an ASTG for an RTL model in accordance with some embodiments of the present invention.

FIG. 4B illustrates an ASTG for an RTL model in accordance with some embodiments of the present invention.

Note that ASTG 422 looks exactly like ASTG 402 because HLM 202 and RTL model 204 are functionally equivalent. ASTG 422 includes three nodes that correspond to checkpoints C1, C2, and C3. Edge 424 corresponds to a symbolic simulation path in FSM controller 206 that starts at state "START" and ends at state "ITER" with the path condition "$i<b$." Edge 432 corresponds to a symbolic simulation path in FSM controller 206 which starts at state "START" and ends at state "DONE" with the path condition "$i \geq b$." Edge 426 corresponds to a symbolic simulation path in FSM controller 206 that starts at state "ITER" and ends at state "ITER" with the path condition "$i<b$." Edge 428 corresponds to a symbolic simulation path in FSM controller 206 which starts at state "ITER" and ends at state "DONE" with the path condition "$i \geq b$." Finally, edge 430 corresponds to a symbolic simulation path in FSM controller 206 that starts at state "DONE" and ends at state "START" with a path condition that is always true, e.g., a path condition "1" or "true."

In some embodiments, instead of creating an ASTG for the RTL model and then checking equivalency between the two ASTGs, the system checks whether, for each edge in the HLM ASTG which is associated with a specific condition, there is a corresponding edge in the RTL model ASTG which is associated with the same condition.

Figure 5:
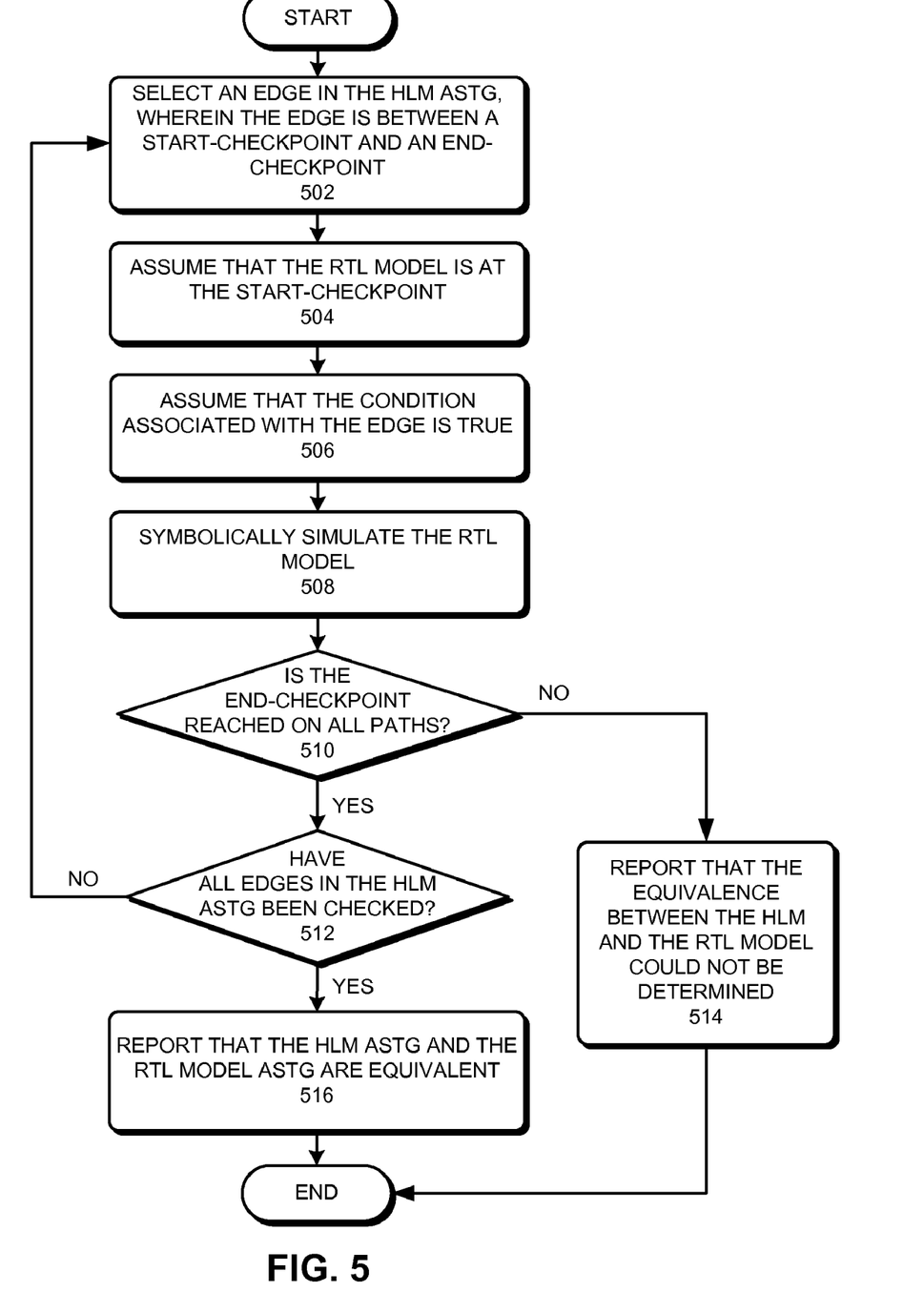
FIG. 5 presents a flowchart that illustrates a process for checking equivalence between an HLM ASTG and an RTL model ASTG in accordance with some embodiments of the present invention.

FIG. 5 presents a flowchart that illustrates a process for checking equivalence between an HLM ASTG and an RTL model ASTG in accordance with some embodiments of the present invention. Specifically, equivalence between the HLM ASTG and the RTL model ASTG can be checked by performing the process illustrated in FIG. 5 for each edge in the HLM ASTG.

Let us assume that the system is performing the process shown in FIG. 5 for a particular edge in the HLM ASTG which is between a start-checkpoint and an end-checkpoint. Specifically, the process can begin by selecting an edge in the HLM ASTG, wherein the edge is between a start-checkpoint and an end-checkpoint (step 502). Next, the system can assume that the RTL model is at the start-checkpoint (step 504). Specifically, the system can assume that the characteristic function associated with the start-checkpoint is true. Next, the system can assume that the condition associated with the edge is true (step 506).

The system can then symbolically simulate the RTL model (step 508), and check whether the end-checkpoint is reached on all paths (step 510) under the given conditions. Specifically, after each symbolic simulation step, the system can check if the end-checkpoint is reached by checking whether the characteristic function of the end-checkpoint is true. If the characteristic function for the end-checkpoint becomes true while simulating along a path, symbolic simulation is discontinued for that path. If no more active paths remain, then the system can determine that the end-checkpoint was reached for all paths. In this case, the "YES" branch of step 510 can be taken. On the other hand, if the simulation reaches a checkpoint that is different from the end-checkpoint, or if a simulation limit is reached before reaching the end-checkpoint, the system can determine that the end-checkpoint is not reached on all paths. In this case the "NO" branch of step 510 can be taken, and the system can report that the equivalence between the HLM and the RTL model could not be determined (step 514).

If the end-checkpoint is reached on all paths, the system can determine if all edges in the HLM ASTG have been checked (step 512). If so, the system can report that the HLM ASTG and the RTL model ASTG are equivalent (step 516).

Once the system determines that the HLM ASTG and the RTL model ASTG are equivalent, the system can begin constructing invariant proof problems which, if solved, will formally prove the equivalence between the HLM and the RTL model. Specifically, the system can create a proof problem for each edge in the HLM ASTG. In some embodiments, the invariant proof problem for an edge in the HLM ASTG can be described as follows. Assume that (1) the variables in the HLM and the corresponding registers in the RTM model are related by a start-checkpoint invariant (e.g., the variables and the registers have the same values) at the start-checkpoint, and (2) the path condition that corresponds to the edge is true. Now prove that an end-checkpoint invariant (which can be the same or different from the start-checkpoint invariant) holds at the end-checkpoint (e.g., prove that the variables in the HLM and the corresponding registers in the RTM model have the same values at the end-checkpoint). A process for creating such proof problems is explained below.

Invariant

Figure 6:
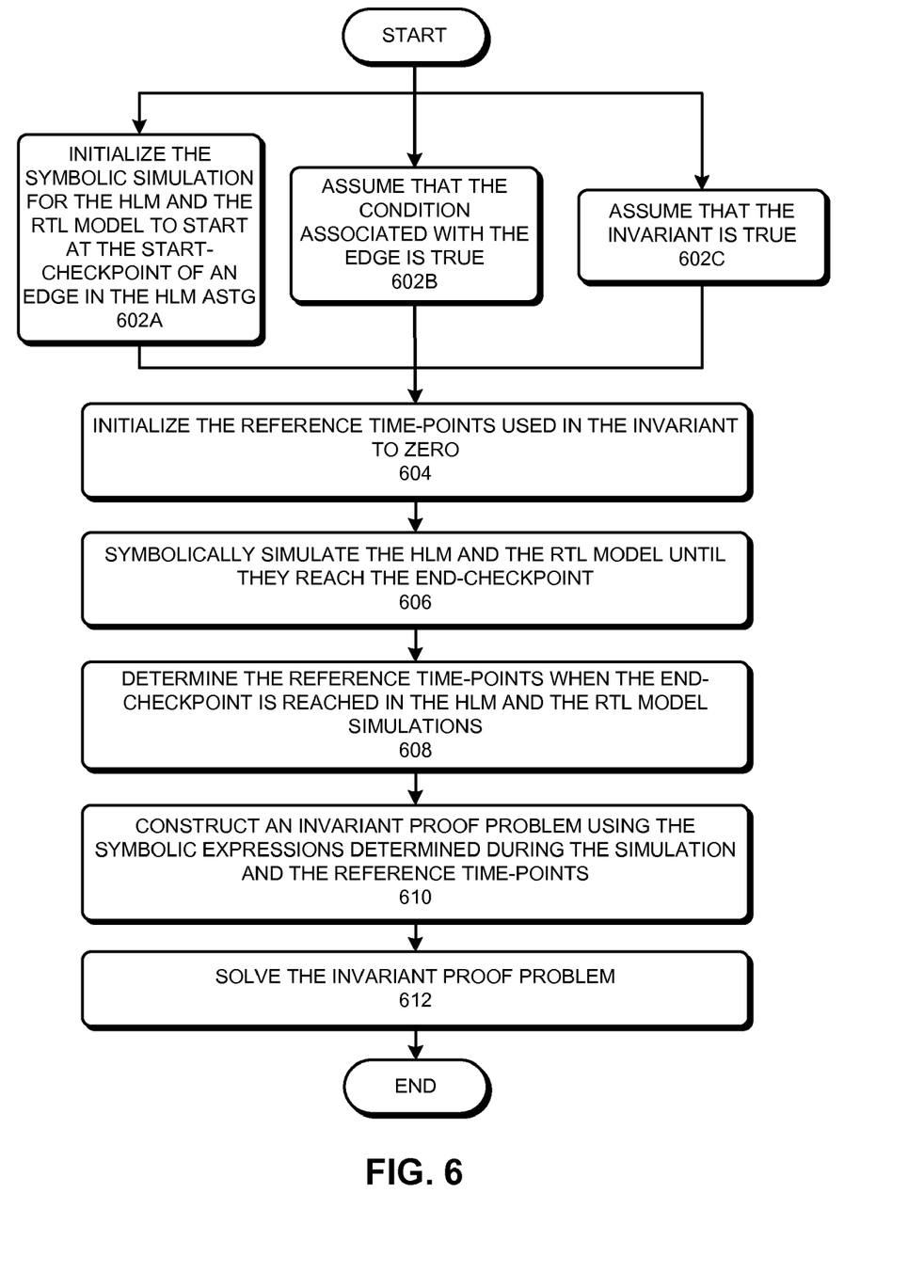
FIG. 6 presents a flowchart that illustrates a process for creating invariant proof problems in accordance with some embodiments of the present invention.

FIG. 6 presents a flowchart that illustrates a process for creating invariant proof problems in accordance with some embodiments of the present invention. Specifically, the system can perform the process illustrated in FIG. 6 for each edge in the HLM ASTG.

The process can begin by (1) initializing the symbolic simulation for the HLM and the RTL model to start at the start-checkpoint of an edge in the HLM ASTG (step 602A), (2) assuming that the condition associated with the edge is true (step 602B), and (3) assuming that the invariant is true (step 602C).

Additionally, the system can initialize the reference time-points in the invariant to be equal to zero (step 604). Note that the reference time-points are updated during the simulation, and are used to construct the invariant proof problem.

The system can then symbolically simulate the HLM and the RTL model until the end-checkpoint is reached in both models (step 606). Note that, during the symbolic simulation, the system generates symbolic expressions that represent the values in the variables in the HLM and the registers in the RTL model.

Next, the system can determine the reference time-points when the end-checkpoint is reached in the HLM and the RTL model simulations (step 608). The values in the reference time-points indicate when the end-checkpoint was reached in the symbolic simulation of the two models.

The system can then construct an invariant proof problem using the symbolic expressions determined during the simulation and the reference time-points (step 610). Next, the system can solve the invariant proof problem (step 612). The system can solve the invariant proof problem using any of the standard proof techniques and solvers (e.g., SAT solvers, SMT solvers) that operate on Boolean formulas.

For example, suppose the initialization of the HLM and the RTL model at the start-checkpoint can be represented using the Boolean formulas initH and initR, respectively. Further, assume that the path conditions associated with the edge can be represented using the Boolean formulas pcH and pcR in the HLM and the RTL model, respectively. Additionally, suppose the invariant at the start-checkpoint is invSTART, and the invariant at the end-checkpoint is invEND. Note that all of the above Boolean formulas are defined over symbolic values.

When the HLM is symbolically simulated, each variable in the HLM can be represented using a symbolic expression based on the symbolic values that were assigned to the variables at initialization. Similarly, when the RTL model is simulated, each register in the RTL model can be represented using a symbolic expression based on the symbolic values that were assigned to the registers at initialization. Let simulH and simulR represent the symbolic expressions that are generated during simulation for the variables in the HLM and the registers in the RTM model, respectively. If Boolean function f is defined over the variables of the HLM and the registers of the RTM model, then the notation f (simulH, simulR) represents a Boolean expression in which each variable and register in f is replaced by the equivalent symbolic expression as defined in simulH and simulR. Now, the invariant proof problem is to show that the following Boolean formula is true under all allowable truth-value assignments:

$$\text{init}H \wedge \text{init}R \wedge pcH \wedge pcR \wedge \text{invSTART} \Rightarrow \text{invEND}(\text{simul}H, \text{simul}R).$$

As mentioned above, the system creates an invariant proof problem for each edge in the HLM ASTG. If the system is able to solve all of the invariant proof problems, then the system can declare that the HLM and the RTL model are functionally equivalent. On the other hand, if the system finds a counter-example for at least one invariant proof problem, or if the system runs out of time trying to solve the proof problems, the system can report that it was unable to determine whether the HLM and the RTL model are functionally equivalent.

Note that finding a counter-example does not necessarily imply that the models are not functionally equivalent. This is because the symbolic simulation may not take into account certain relationships between the symbolic values which may prevent certain value combinations at the start-checkpoint. These false negatives can be removed by adding more information about the allowable variable and register values. For example, reachability computation can be performed to remove false negatives. In reachability computation, the set of reachable states of an FSM are determined. If the equivalence checking process restricts the variable and register values to only the reachable values, then the equivalence proof becomes complete, i.e., all false negatives are eliminated. Reachability computation can require a large amount of computational resources. Hence, an approximation of such a technique is often used in practice.

Process for Checking Formal Equivalence

Figure 7:
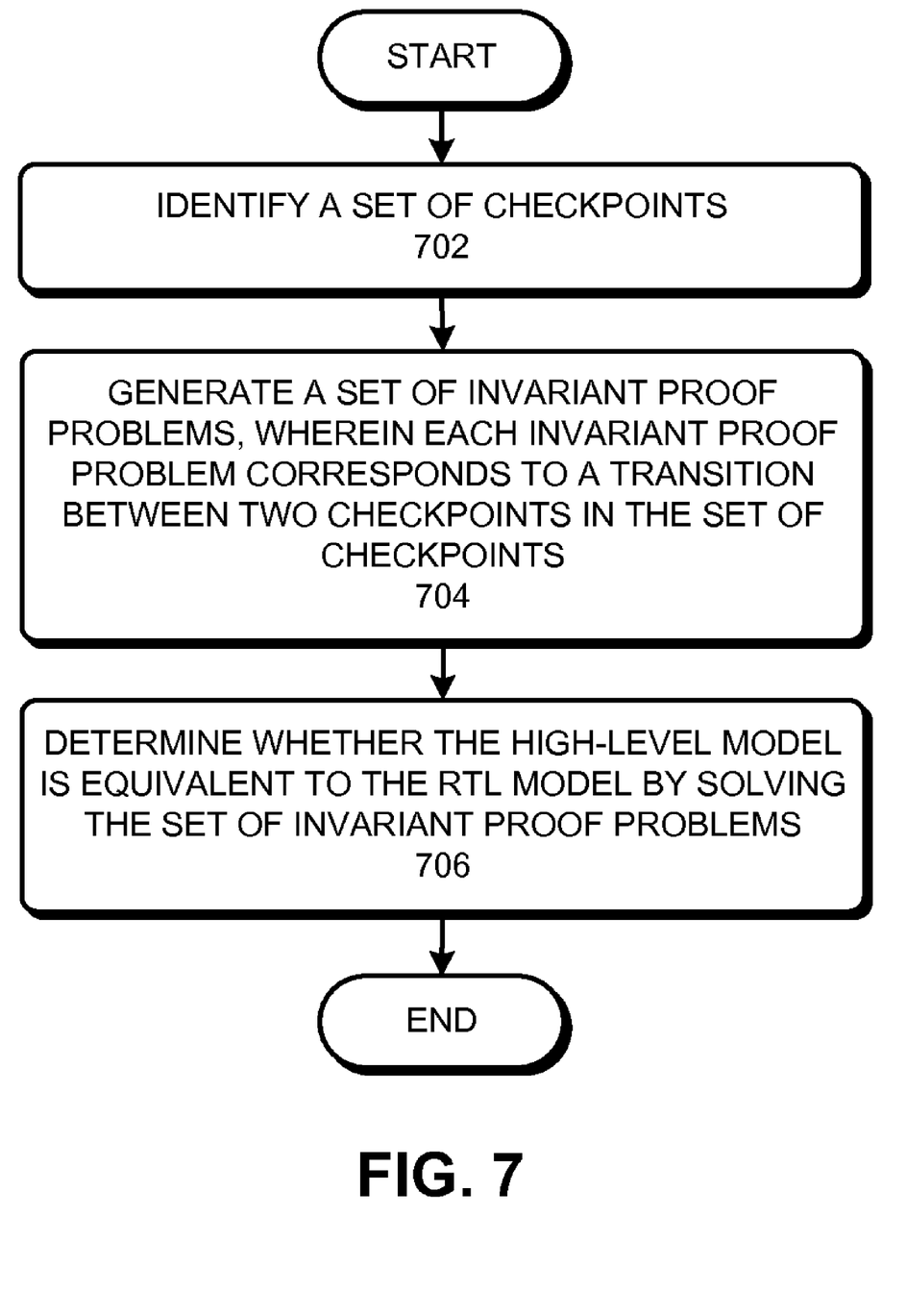
FIG. 7 presents a flowchart that illustrates a process for determining whether an HLM is equivalent to an RTL model in accordance with some embodiments of the present invention.

FIG. 7 presents a flowchart that illustrates a process for determining whether an HLM is equivalent to an RTL model in accordance with some embodiments of the present invention.

When an RTL model is created from an HLM, a mapping between variables in the HLM and registers in the RTL model can be determined. Next, the system can identify a set of checkpoints (step 702). Each checkpoint can be associated with: (a) a characteristic function which uses one or more states of an FSM representation of the HLM, wherein the characteristic function specifies when the HLM is at the checkpoint, or a location in the HLM, wherein the location is either before or after a program statement in the HLM; (b) a characteristic function which uses one or more states of an FSM representation of the RTL model, wherein the characteristic function specifies when the RTL model is at the checkpoint; and (c) an invariant which is defined over a set of variables in the HLM and a corresponding set of registers in the RTL model, wherein the invariant specifies a relationship between a variable in the set of variables and a register in the set of registers at a given time-point.

The system can then generate a set of invariant proof problems, wherein each invariant proof problem corresponds to a transition between two checkpoints in the set of checkpoints (step 704). Specifically, the system can generate an invariant proof problem for each transition in an ASTG for the HLM.

In some embodiments, the system can determine whether an ASTG for the HLM is equivalent to an ASTG for the RTL model. Specifically, the system can first determine an ASTG for the HLM. Next, for each transition in the ASTG for the HLM, the system can determine whether the ASTG for the RTL has an equivalent transition. If the system determines that the ASTG for the HLM is not equivalent to the ASTG for the RTL, the system can report that the HLM is not equivalent to the RTL model. On the other hand, if the system determines that the ASTG for the HLM is equivalent to the ASTG for the RTL model, the system can then generate the set of invariant proof problems. In some embodiments, after checking that a transition in the ASTG for the HLM has an equivalent transition in the RTL model, the system can generate an invariant proof problem based on the transition.

The system can determine an ASTG for the HLM as follows. First, the system can perform a forward symbolic simulation from a first location (e.g., location L1) in the HLM which is associated with a first checkpoint (e.g., checkpoint C1). If the forward symbolic simulation reaches a second location (e.g., location L2) in the HLM which is associated with a second checkpoint (e.g., checkpoint C2), the system can create a transition between the first checkpoint and the second checkpoint in the ASTG for the HLM. Note that, if the first checkpoint is the same as the second checkpoint, the transition is a self loop (e.g., edge 406 in FIG. 4A).

The system can determine equivalency between the two ASTGs as follows. For a given transition between a start-checkpoint and an end-checkpoint in the HLM, the system can identify a start-checkpoint in the RTL model which corresponds to the start-checkpoint in the HLM. Next, the system can perform a forward symbolic simulation from the start-checkpoint in the RTL model, wherein the forward symbolic simulation assumes any conditions associated with the transition to be true. The system can then determine whether the forward symbolic simulation reaches an end-checkpoint in the RTL model which corresponds to the end-checkpoint for the transition in the HLM. If so, the RTL model has an equivalent transition. If not, the system was unable to determine the equivalence between the HLM and the RTL model (e.g., because the approach was not powerful enough).

Next, the system can determine whether the HLM is equivalent to the RTL model by solving the set of invariant proof problems (step 706). The invariant proof problems can be solved by using any of the standard proof techniques and solvers (e.g., SAT solvers, SMT solvers) that operate on Boolean formulas.

Apparatus and Computer System

Figure 8:
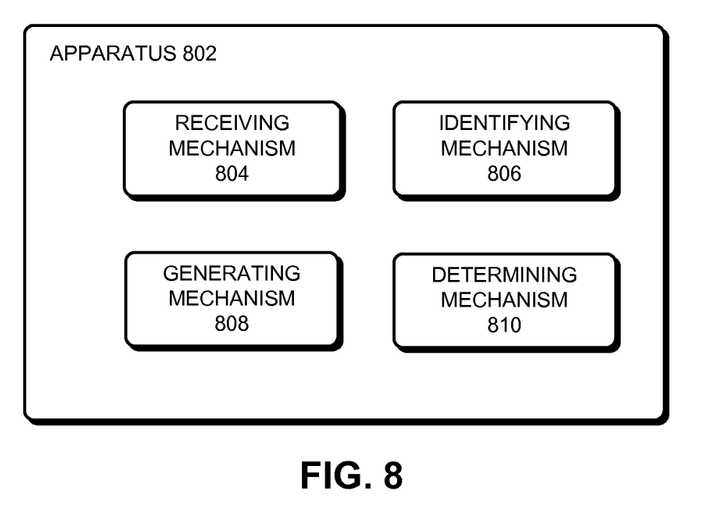
FIG. 8 illustrates an apparatus in accordance with some embodiments of the present invention.

FIG. 8 illustrates an apparatus in accordance with some embodiments of the present invention.

Apparatus 802 can comprise mechanisms which communicate with one another via a wired or wireless communication channel. Apparatus 802 may be realized using one or more integrated circuits, and apparatus 802 may include fewer or more mechanisms than those shown in FIG. 8. Further, apparatus 802 may be integrated in a computer system, or it may be realized as a separate device which is capable of communicating with other computer systems and/or devices.

Apparatus 802 can include one or more mechanisms which are configured to perform processes which are inherently or explicitly described in this disclosure. Specifically, apparatus 802 can comprise receiving mechanism 804, identifying mechanism 806, generating mechanism 808, and determining mechanism 810. Each mechanism may be realized using one or more integrated circuits or as a module of a general purpose processor. Receiving mechanism 804 may be configured to receive a set of variables in an HLM and a corresponding set of registers in a corresponding RTL model; identifying mechanism 806 may be configured to identify a set of checkpoints; generating mechanism 808 may be configured to generate a set of invariant proof problems; and determining mechanism 810 may be configured to determine whether the RTL model is equivalent to the HLM by solving the set of invariant proof problems.

Figure 9:
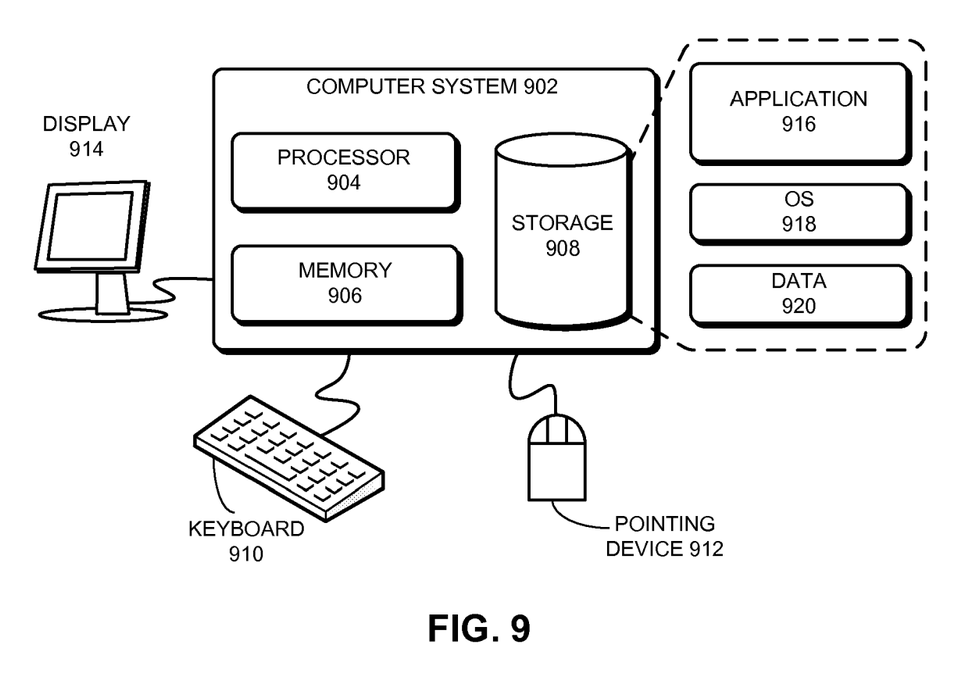
FIG. 9 illustrates a computer system in accordance with some embodiments of the present invention.

FIG. 9 illustrates a computer system in accordance with some embodiments of the present invention.

A computer or computer system can generally be any system that can perform computations. Specifically, a computer can be a microprocessor-based system which may include multiple processing cores, a network-processor-based system, a digital-signal-processor-based system, a portable computing device, a personal organizer, a distributed-computing-platform-based system, or any other computing system now known or later developed. Computer system 902 comprises processor 904, memory 906, and storage 908. Computer system 902 can be coupled with display 914, keyboard 910, and pointing device 912. Storage 908 can generally be any device that can store data. In some embodiments, storage 908 can include a non-transitory computer-readable storage medium. Specifically, a storage device can be a magnetic, an optical, or a magneto-optical storage device, or it can be based on flash memory and/or battery-backed up memory. Storage 908 can store application 916, operating system 918, and data 920.

Application 916 can include instructions that when executed by computer 902 cause computer 902 to perform one or more processes which are inherently or explicitly described in this disclosure. Data 920 can include any data that is required as input or that is generated as output by the methods and/or processes described in this disclosure.

CONCLUSION

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for determining whether a high-level model (HLM) for a circuit design is equivalent to a register-transfer-level (RTL) model for the circuit design, the method comprising:
identifying a set of checkpoints, wherein each checkpoint is associated with:
a first component which specifies a first characteristic function using one or more states of a finite-state-machine (FSM) representation of the HLM;
a second component which specifies a second characteristic function using one or more states of an FSM representation of the RTL model; and
a third component which describes an invariant using a set of variables in the HLM and a set of registers in the RTL model;
generating a set of invariant proof problems, wherein each invariant proof problem corresponds to a transition between two checkpoints in the set of checkpoints; and
determining, using a computer, whether the HLM is equivalent to the RTL model by solving the set of invariant proof problems.

2. The method of claim 1, wherein the first characteristic function is associated with a location in the HLM which is either before or after a program statement in the HLM.

3. The method of claim 1, wherein the invariant specifies a relationship between a variable in the set of variables and a register in the set of registers at a given time-point.

4. The method of claim 1, further comprising:
determining whether an abstract state transition graph (ASTG) for the HLM is equivalent to an ASTG for the RTL model; and
in response to determining that the ASTG for the HLM is not equivalent to the ASTG for the RTL, reporting that the equivalence between the HLM and the RTL model could not be determined.

5. The method of claim 4, wherein determining whether the ASTG for the HLM is equivalent to the ASTG for the RTL model includes:
determining the ASTG for the HLM; and
for each transition in the ASTG for the HLM, determining whether the ASTG for the RTL has an equivalent transition.

6. The method of claim 5, wherein determining the ASTG for the HLM includes:
performing a forward symbolic simulation from a first location in the HLM which is associated with a first checkpoint; and
in response to determining that the forward symbolic simulation reaches a second location in the HLM which is associated with a second checkpoint, creating a transition between the first checkpoint and the second checkpoint in the ASTG for the HLM, wherein if the first checkpoint is the same as the second checkpoint, the transition is a self loop.

7. The method of claim 5, wherein determining whether the ASTG for the RTL has an equivalent transition includes:

identifying a start-checkpoint in the RTL model which corresponds to a start-checkpoint for a transition in the HLM;
performing a forward symbolic simulation from the start-checkpoint in the RTL model, wherein the forward symbolic simulation assumes any conditions associated with the transition to be true; and
determining whether the forward symbolic simulation reaches an end-checkpoint in the RTL model which corresponds to an end-checkpoint for the transition in the HLM.

8. A non-transitory computer-readable storage medium storing instructions that when executed by a computer cause the computer to perform a method for determining whether a high-level model (HLM) for a circuit design is equivalent to a register-transfer-level (RTL) model for the circuit design, the method comprising:
identifying a set of checkpoints, wherein each checkpoint is associated with:
a first component which specifies a first characteristic function using one or more states of a finite-state-machine (FSM) representation of the HLM;
a second component which specifies a second characteristic function using one or more states of an FSM representation of the RTL model; and
a third component which describes an invariant using a set of variables in the HLM and a set of registers in the RTL model;
generating a set of invariant proof problems, wherein each invariant proof problem corresponds to a transition between two checkpoints in the set of checkpoints; and
determining whether the HLM is equivalent to the RTL model by solving the set of invariant proof problems.

9. The non-transitory computer-readable storage medium of claim 8, wherein the first characteristic function is associated with a location in the HLM which is either before or after a program statement in the HLM.

10. The non-transitory computer-readable storage medium of claim 8, wherein the invariant specifies a relationship between a variable in the set of variables and a register in the set of registers at a given time-point.

11. The non-transitory computer-readable storage medium of claim 8, the method further comprising:
determining whether an abstract state transition graph (ASTG) for the HLM is equivalent to an ASTG for the RTL model; and
in response to determining that the ASTG for the HLM is not equivalent to the ASTG for the RTL, reporting that the equivalence between the HLM and the RTL model could not be determined.

12. The non-transitory computer-readable storage medium of claim 11, wherein determining whether the ASTG for the HLM is equivalent to the ASTG for the RTL model includes:
determining the ASTG for the HLM; and
for each transition in the ASTG for the HLM, determining whether the ASTG for the RTL has an equivalent transition.

13. The non-transitory computer-readable storage medium of claim 12, wherein determining the ASTG for the HLM includes:
performing a forward symbolic simulation from a first location in the HLM which is associated with a first checkpoint; and
in response to determining that the forward symbolic simulation reaches a second location in the HLM which is associated with a second checkpoint, creating a transition between the first checkpoint and the second checkpoint in the ASTG for the HLM, wherein if the first checkpoint is the same as the second checkpoint, the transition is a self loop.

14. The non-transitory computer-readable storage medium of claim 12, wherein determining whether the ASTG for the RTL has an equivalent transition includes:
identifying a start-checkpoint in the RTL model which corresponds to a start-checkpoint for a transition in the HLM;
performing a forward symbolic simulation from the start-checkpoint in the RTL model, wherein the forward symbolic simulation assumes any conditions associated with the transition to be true; and
determining whether the forward symbolic simulation reaches an end-checkpoint in the RTL model which corresponds to an end-checkpoint for the transition in the HLM.

15. An apparatus for determining whether a high-level model (HLM) for a circuit design is equivalent to a register-transfer-level (RTL) model for the circuit design, the apparatus comprising:
an identifying mechanism configured to identify a set of checkpoints, wherein each checkpoint is associated with:
a first component which specifies a first characteristic function using one or more states of a finite-state-machine (FSM) representation of the HLM;
a second component which specifies a second characteristic function using one or more states of an FSM representation of the RTL model; and
a third component which describes an invariant using a set of variables in the HLM and a set of registers in the RTL model;
a generating mechanism configured to generate a set of invariant proof problems, wherein each invariant proof problem corresponds to a transition between two checkpoints in the set of checkpoints; and
a determining mechanism configured to determine whether the HLM is equivalent to the RTL model by solving the set of invariant proof problems.

16. The apparatus of claim 15, wherein the first characteristic function is associated with a location in the HLM which is either before or after a program statement in the HLM.

17. The apparatus of claim 15, wherein the invariant specifies a relationship between a variable in the set of variables and a register in the set of registers at a given time-point.

18. The apparatus of claim 15, wherein generating the set of invariant proof problems comprises:
determining whether an abstract state transition graph (ASTG) for the HLM is equivalent to an ASTG for the RTL model; and
in response to determining that the ASTG for the HLM is not equivalent to the ASTG for the RTL, reporting that the equivalence between the HLM and the RTL model could not be determined.

19. The apparatus of claim 18, wherein determining whether an ASTG for the HLM is equivalent to an ASTG for the RTL model comprises:
determining the ASTG for the HLM; and
for each transition in the ASTG for the HLM, determining whether the ASTG for the RTL has an equivalent transition.

20. The apparatus of claim 19, wherein determining the ASTG for the HLM comprises:
performing a forward symbolic simulation from a first location in the HLM which is associated with a first checkpoint; and
in response to determining that the forward symbolic simulation reaches a second location in the HLM which is associated with a second checkpoint, creating a transition between the first checkpoint and the second checkpoint in the ASTG for the HLM, wherein if the first checkpoint is the same as the second checkpoint, the transition is a self loop.

21. The apparatus of claim 19, wherein determining whether the ASTG for the RTL has an equivalent transition comprises:
identifying a start-checkpoint in the RTL model which corresponds to a start-checkpoint for a transition in the HLM;
performing a forward symbolic simulation from the start-checkpoint in the RTL model, wherein the forward symbolic simulation assumes any conditions associated with the transition to be true; and
determining whether the forward symbolic simulation reaches an end-checkpoint in the RTL model which corresponds to an end-checkpoint for the transition in the HLM.

* * * * *